(12) United States Patent
Chung et al.

(10) Patent No.: US 8,709,979 B2
(45) Date of Patent: Apr. 29, 2014

(54) METHOD OF PREPARING MGB$_2$ SUPERCONDUCTING WIRE AND THE MGB$_2$ SUPERCONDUCTING WIRE PREPARED THEREBY

(75) Inventors: Kook-Chae Chung, Jinhae-si (KR); Tae-Hoon Kim, Changwon-si (KR); Soon-Tae Ahn, Busan (KR); Bharat Sinha Bhavesh, Changwon-si (KR)

(73) Assignee: Korea Institute of Machinery and Materials, Daejeon (KR)

(*) Notice: Subject to any disclaimer, the term of this patent is extended or adjusted under 35 U.S.C. 154(b) by 39 days.

(21) Appl. No.: 13/255,969

(22) PCT Filed: Jul. 2, 2010

(86) PCT No.: PCT/KR2010/004320
§ 371 (c)(1),
(2), (4) Date: Sep. 12, 2011

(87) PCT Pub. No.: WO2011/155659
PCT Pub. Date: Dec. 15, 2011

(65) Prior Publication Data
US 2012/0094841 A1    Apr. 19, 2012

(51) Int. Cl.
*C04B 35/45* (2006.01)
*H01L 39/24* (2006.01)

(52) U.S. Cl.
USPC .......................................... 505/490; 505/430

(58) Field of Classification Search
USPC ............... 505/430, 433, 434, 490, 491, 501
See application file for complete search history.

(56) References Cited

U.S. PATENT DOCUMENTS

| | | |
|---|---|---|
| 2002/0198111 A1 | 12/2002 | Tomsic |
| 2005/0163644 A1 | 7/2005 | Thieme et al. |
| 2005/0245400 A1* | 11/2005 | Dou et al. ............ 505/100 |
| 2009/0156410 A1 | 6/2009 | Nakane et al. |
| 2010/0081573 A1* | 4/2010 | Dou et al. ............ 505/425 |

FOREIGN PATENT DOCUMENTS

| | | |
|---|---|---|
| JP | 2002294306 A | 10/2002 |
| KR | 100148636 B1 | 5/1998 |

OTHER PUBLICATIONS

International Search Report and Written Opinion, completed Jan. 7, 2011 for PCT Application No. PCT/KR2010/0043230, from which the instant application is based, 6 pages.

* cited by examiner

*Primary Examiner* — Colleen Dunn
(74) *Attorney, Agent, or Firm* — Fredrikson & Byron, P.A.

(57) ABSTRACT

Disclosed herein is a method of preparing a MgB$_2$ superconducting wire and the MgB$_2$ superconducting wire prepared thereby. The method comprising rolling a raw powder by using a powder rolling method. According to the method of the present invention has an effect of increasing an effective area where superconducting current can flow by improvement of the connectivity of a MgB$_2$ superconducting powder and achievement of high density through a powder rolling process, and maintaining an uniform current value even in a large length because of the improvement of the connectivity.

18 Claims, 3 Drawing Sheets

METHOD OF PREPARING MGB$_2$ SUPERCONDUCTING WIRE AND THE MGB$_2$ SUPERCONDUCTING WIRE PREPARED THEREBY

Related Applications

This application is a 35 U.S.C. 371 national stage filing from International Application No. PCT/KR 2010/004320 filed Jul. 2,2010 and claims priority to Korean Application No. KR 10-2010-0054803 filed Jun. 10,2020the teachings of which are incorporated herein by reference.

CROSS-REFERENCES TO RELATED APPLICATION

This patent application claims the benefit of priority under 35 U.S.C. §119 from Korean Patent Application No. 10-2010-0054803 filed on Jun. 10, 2010, the contents of which are incorporated herein by reference.

BACKGROUND OF THE INVENTION

1. Field of the Invention

The present disclosure relates to a method of preparing a MgB$_2$ superconducting wire and the MgB$_2$ superconducting wire prepared thereby, and more particularly, to a method of preparing a MgB$_2$ superconducting wire having improved superconducting current conductivity and maintaining uniform current values by improving density and increasing connectivity through a rolling process of a MgB$_2$ superconducting powder and the MgB$_2$ superconducting wire prepared thereby.

2. Description of the Related Art

Typically, there are two major methods of preparing a MgB$_2$ superconducting wire, i.e., powder-in-tube (PIT) and continuous tube forming and filling (CTFF) methods and the MgB$_2$ superconducting wire has been prepared by using PIT and CTFF methods.

The PIT is a method of charging the inside of a tube-shaped metal sheath with a MgB$_2$ powder or a mixed powder of magnesium and boron, and the CTFF is a method in which a plate-shaped metal sheath is formed into a "U" shape, and then a MgB$_2$ powder or a mixed powder of magnesium and boron is charged therein and the metal sheath is rolled into an "O" shape. In the two methods, diameters will be decreased and lengths will be increased through drawing processes after completing the charging processes.

Since the two methods have limitations in increasing packing density of the powders, an effective area where superconducting current flows and connectivity of a superconducting phase in a longitudinal direction will decrease. Therefore, very severe problem regarding the respect such as uniformity may be occurred in case of superconducting long wire having a length of 1 km or more.

With respect to the PIT method, a process has to be performed on a sheath having a very large diameter or having a slightly smaller diameter and a long length in the beginning in order to prepare a long wire. At this time, although charging the inside of the sheath with a superconducting powder is facilitated and the density may be increased when the diameter is large, process time will be very long and continuous maintaining of high density will be difficult because the diameter of the wire has to be continuously decreased in the process of preparing a long wire. Also, when the diameter is small and the length is large, it is difficult to charge with a superconducting powder initially and increase density.

Meanwhile, the CTFF method has an advantage in which a process begins with a shape of a metal plate having a somewhat large length due to the nature of the process. However, after the forming of a U-shaped tube, since the powder is charged therein only by its own weight, there is a limitation in that density of the inside superconducting powder is not so high after the forming of an O-shaped tube.

Accordingly, the present inventors paid attention to a process of preparing metal plates by means of a powder rolling process and the powder rolling was applied to a method of preparing a MgB$_2$ superconducting wire. Therefore, the present invention overcoming the limitations of the PIT and CTFF methods was completed.

SUMMARY OF THE INVENTION

Embodiments of the present invention are directed to provide a method of preparing a MgB$_2$ superconducting wire, in which high density of the MgB$_2$ superconducting wire is achieved by improving limitations of typical PIT and CTFF processes and as a result, connectivity of the wire is improved, and the MgB$_2$ superconducting wire prepared thereby.

According to an aspect of the present invention, there is provided a method of preparing a MgB$_2$ superconducting wire including rolling a MgB$_2$ raw powder by using a powder rolling method.

According to the method of preparing a MgB$_2$ superconducting wire of the present invention and the MgB$_2$ superconducting wire prepared thereby, the present invention has an effect of increasing an effective area where superconducting current can flow by improvement of the connectivity of a MgB$_2$ superconducting powder and achievement of high density through a powder rolling process, and maintaining an uniform current value even in a large length because of the improvement of the connectivity.

Also, although a diameter of a sheath, in which the superconducting powder is charged, has to be large in order to prepare a long wire in typical PIT and CTFF processes, the present invention has an advantageous effect on production rate as well as production cost of the wire because a process in the present invention begins with the sheath having a size close to the size of the final wire.

Further, the present invention can also be applied to a process of adding various dopants that function as flux pinning centers in order to improve flux pinning characteristics of a MgB$_2$ superconducting wire under a magnetic field.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Features and advantages of the present invention will be more clearly understood by the following detailed description of the present preferred embodiments by reference to the accompanying drawings. It is first noted that terms or words used herein should be construed as meanings or concepts corresponding with the technical sprit of the present invention, based on the principle that the inventor can appropriately define the concepts of the terms to best describe his own invention. Also, it should be understood that detailed descriptions of well-known functions and structures related to the present invention will be omitted so as not to unnecessarily obscure the important point of the present invention.

Hereinafter, the present invention will be described in detail.

The powder rolling method may prepare a material and an alloy that have high melting points and are difficult to be melted as well as being appropriate for rolling a material having poor processability.

Figure 1:
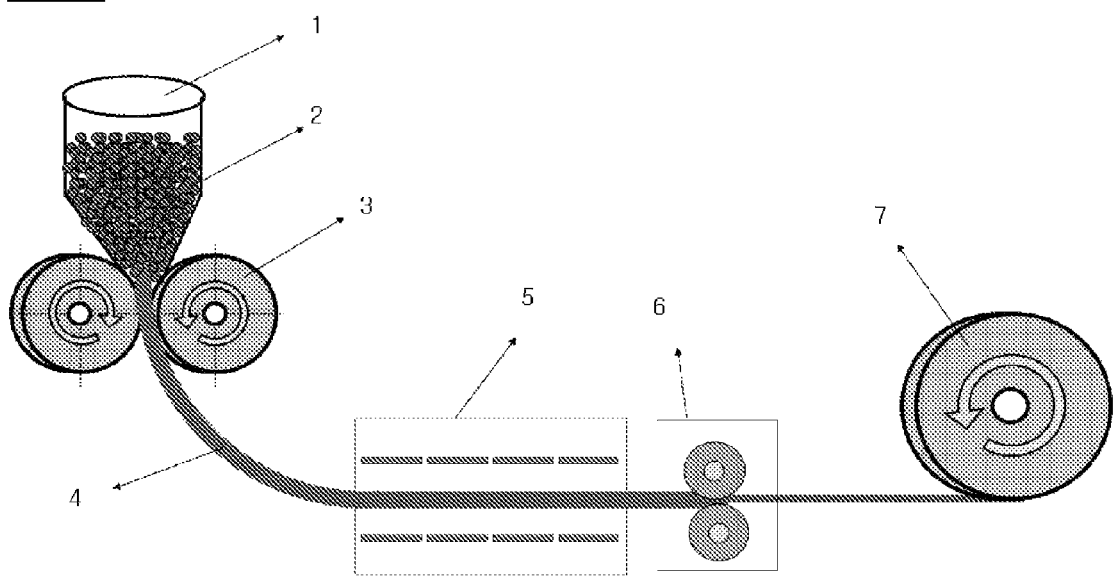
FIG. 1 is a process diagram illustrating production of a metal plate by means of a powder rolling process.

A process diagram of producing a metal plate by using the powder rolling method is presented in FIG. 1.

The present invention provides a method of preparing a $MgB_2$ superconducting wire characterized in that a raw powder is rolled through the powder rolling method by applying the powder rolling method producing the metal plate to the preparation of the superconducting wire.

Figure 2:
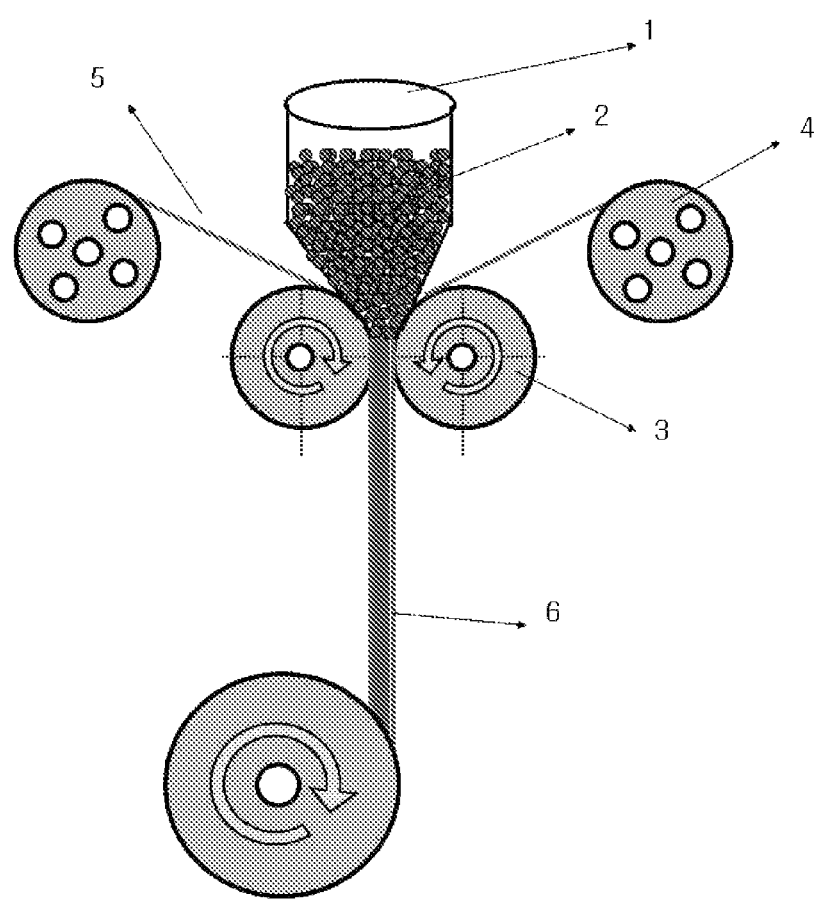
FIG. 2 is a process diagram illustrating preparation of a MgB$_2$ superconducting wire by means of a powder rolling process.

At this time, a process diagram of the preparing method in the present invention is presented in FIG. 2.

As illustrated in FIG. 2, the preparing method of the present invention is performed by a rolling process including: a hopper 1 for powder supplying; a raw powder 2 supplied to the hopper; a roll 3 rolling a $MgB_2$ powder; a roll 4 supplying a metal sheath enclosing the raw powder; the metal sheath 5 supplied by the roll 4; and a wire 6 prepared by powder rolling.

At this time, the raw powder supplied to the hopper for powder supplying is selected from the group consisting of a pre-reacted $MgB_2$ powder, a mixed powder of magnesium and boron, and a powder in which a dopant is added to the mixed powder, and the preparing method of the present invention may also be easily applied to a process of adding various dopants.

The dopant is selected from the group consisting of SiC, carbon nanotubes, hydrocarbons, silicon oil, a malic acid, tin, and silver, and the dopant functions as a flux pinning center in the $MgB_2$ superconducting wire of the present invention and has an effect of improving superconducting flux pinning characteristics under a magnetic field.

The preparing method of rolling the raw powder by using the powder rolling method of the present invention may further include a process of coating a metal sheath simultaneously with rolling.

A metal sheath coated wire may be continuously prepared by coating the metal sheath simultaneously with rolling and the wire having a length longer than that of a typical process may be prepared faster and efficiently.

At this time, the metal sheath is supplied in a powder form or a metal plate form and is appropriate for the powder rolling process of the present invention because the coated metal sheath is supplied to the process by being wound on a roll in the foregoing forms.

The rolling roll used in the powder rolling of the present invention is a cold or hot rolling roll.

When the cold rolling roll is used, a very thin wire may be prepared and the wire having high dimensional accuracy and clean surface may be prepared.

When the hot rolling roll is used, small rolling power may be used, large deformation is facilitated, and the rolled material may have properties of forged products.

Therefore, a superconducting wire having small thickness and clean surface may be obtained by applying the cold or hot rolling roll to the preparation of the $MgB_2$ superconducting wire.

Also, the method of preparing the $MgB_2$ superconducting wire of the present invention may be performed by further including a process of heat treating after rolling, and more dense superconducting wire may be prepared by further including the heat treatment. In particular, a heat treatment is necessary for the mixed powder of magnesium and boron, and the mixed powder becomes a $MgB_2$ powder and superconducting characteristics are obtained through the heat treatment.

At this time, the heat treatment is performed in a pure Ar gas or a reducing atmosphere of a mixed gas of Ar and 4 vol. % to 10 vol. % of $H_2$, and as a result, an oxidation reaction that may occur during the heat treatment may be prevented. In particular, with respect to the mixed powder of magnesium and boron, magnesium (Mg) oxidation needs to be prevented because a MgO insulator may be formed due to very high oxidizing potential of Mg.

Also, the heat treatment is performed at a temperature range of 600° C. to 1000° C. for few minutes to few hours, and the connectivity between $MgB_2$ particles may be improved and the residual stress in the powder may be removed through the heat treatment. Further, with respect to the mixed powder, $MgB_2$ will be formed through the heat treatment.

Mg evaporates and reacts with boron to become a $MgB_2$ superconducting material in the case of the mixed powder of magnesium and boron. If the temperature performing the heat treatment is less than 600° C., it may be difficult to form $MgB_2$ because a melting point of Mg is about 650° C.

Also, when the temperature is more than 1000° C., phase decomposition may occur because a melting point of $MgB_2$ is about 800° C., and as a result, other phases such as MgO or $MgB_4$ may be formed.

At this time, although the heat treatment may be performed at a temperature range of 650° C. to 800° C., the range of the heat treatment temperature may be widen to a temperature range of 600° C. to 1000° C. due to particle size, heat treatment time, and dopant effect. However, it is practically desirable to lower the heat treatment temperature.

Also, the present invention provides a $MgB_2$ superconducting wire prepared by using the foregoing preparation method.

The $MgB_2$ superconducting wire of the present invention has a density range of 2.00 g/cm³ to 2.05 g/cm³. This value is about 76.0% to 77.9% of the theoretical density of 2.63 g/cm³. Therefore, it may be understood that a $MgB_2$ superconducting wire having a packing ratio higher than those of wires prepared through typical PIT and CTFF processes may be prepared according to the present invention.

Hereinafter, the present invention is described in detail according to Examples. However, the following Examples are only exemplary of the present invention, and the contents of the present invention are not limited to the following Examples.

EXAMPLE 1

Preparation of $MgB_2$ Superconducting Wire By Powder Rolling Process 1

In the process shown in FIG. 2, 50 g of a $MgB_2$ powder was introduced to a state of no supply of a metal sheath and a $MgB_2$ wire was prepared through a powder rolling process.

The prepared $MgB_2$ wire had a width of about 10 cm in a transverse direction of a rolling roll and a length of about 22 cm in a longitudinal direction. At this time, a gap of the rolling roll was 0.3 mm and the $MgB_2$ superconducting wire was prepared at a rolling roll speed of 0.7 rpm.

EXAMPLE 2

Preparation of $MgB_2$ Superconducting Wire By Powder Rolling Process 2

Except for adjusting a gap of the rolling roll to 0.5 mm, a $MgB_2$ superconducting wire was prepared by using the method of Example 1.

EXAMPLE 3

Preparation of $MgB_2$ Superconducting Wire By Powder Rolling Process 3

Except for adjusting a gap of the rolling roll to 0.7 mm, a $MgB_2$ superconducting wire was prepared by using the method of Example 1.

EXAMPLE 4

Preparation of $MgB_2$ Superconducting Wire By Powder Rolling Process 4

Except for adjusting a gap of the rolling roll to 0.8 mm, a $MgB_2$ superconducting wire was prepared by using the method of Example 1.

EXAMPLE 5

Preparation of $MgB_2$ Superconducting Wire By Powder Rolling Process 5

Except for adjusting a gap of the rolling roll to 0.5 mm and a rolling roll speed to 0.3 rpm, a $MgB_2$ superconducting wire was prepared by using the method of Example 1.

COMPARATIVE EXAMPLE 1

Preparation of $MgB_2$ Bulk By Cylindrical Mold 1

A $MgB_2$ powder was put in a cylindrical mold and a hydraulic pressure of 120 $Kgf/cm^2$ was applied to prepare a $MgB_2$ bulk having a disc shape of 10 mm diameter and 2.32 mm thickness.

COMPARATIVE EXAMPLE 2

Preparation of $MgB_2$ Bulk By Cylindrical Mold 2

Except for applying a hydraulic pressure of 314 $Kgf/cm^2$, a disc-shaped $MgB_2$ bulk was prepared by using the method of Comparative Example 1.

COMPARATIVE EXAMPLE 3

Preparation of $MgB_2$ Wire Through Powder-In-Tube (PIT) Method 1

A $MgB_2$ powder was put in a pure Fe metal sheath tube having an initial length of 100 mm, an outer diameter of 8 mm, and a thickness of 1.5 mm, and a $MgB_2$ wire was prepared after filling up the $MgB_2$ powder while pressing the powder using a 5 mm thick rod.

COMPARATIVE EXAMPLE 4

Preparation of $MgB_2$ Wire Through Powder-in-Tube (PIT) Method 2

A $MgB_2$ wire having an outer diameter of 1.2 mm and a length of about 35 m was prepared by further performing swaging and straight drawing processes on the $MgB_2$ wire prepared in Comparative Example 3.

EXPERIMENTAL EXAMPLE 1

Density Measurement of $MgB_2$ Wire

Densities of the $MgB_2$ wires prepared according to the foregoing Examples were measured to compare with the theoretical density of 2.63 $g/cm^3$, and the results thereof are presented in Table 1 below.

TABLE 1

| | Density of $MgB_2$ Wire | | | | |
|---|---|---|---|---|---|
| | Rolling Roll Gap (mm) | Rolling Roll Speed (rpm) | Wire Thickness (mm) | Wire Density (g/cm3) | Ratio to Theoretical Density (%) |
| Example 1 | 0.3 | 0.7 | 1.09 | 2.051 | 77.985 |
| Example 2 | 0.5 | 0.7 | 1.05 | 2.015 | 76.616 |
| Example 3 | 0.7 | 0.7 | 1.03 | 2.017 | 76.692 |
| Example 4 | 0.8 | 0.7 | 1.08 | 1.984 | 75.437 |
| Example 5 | 0.5 | 0.3 | 1.37 | 2.021 | 76.844 |

As shown in Table 1, the densities of the $MgB_2$ wires prepared according to Examples of the present invention were in a range of 75% to 78% of the theoretical density of 2.63 $g/cm^3$. As a result, it may be understood that a wire having a packing ratio better than those of typical processes may be prepared and the connectivity in the wire may also be improved when compared to the following Experimental Examples 2 and 3.

Also, when the rolling roll speeds are the same, it may be understood that density is the highest when the gap of the rolling roll is 0.3 mm. When the gap conditions of the rolling rolls are the same, it may be understood that large differences in density are not shown even if the rolling roll speed is changed.

EXPERIMENTAL EXAMPLE 2

Density Measurement of $MgB_2$ Bulk

Densities of the $MgB_2$ bulks prepared according to Comparative Examples 1 and 2 were measured to compare with the theoretical density of 2.63 $g/cm^3$, and the results thereof are presented in Table 2 below.

TABLE 2

| Density of $MgB_2$ Bulk | | | | |
|---|---|---|---|---|
| Hydraulic Pressure (Kgf/cm²) | Bulk Thickness (mm) | Bulk Diameter (mm) | Bulk Density (g/cm³) | Ratio to Theoretical Density (%) |
| 120 | 2.32 | 10 | 1.944 | 73.916 |
| 314 | 1.72 | 10 | 1.955 | 74.335 |

As shown in Table 2, with respect to the $MgB_2$ bulks formed by a mold, it may be understood that densities are low at about 3% in terms of the ratio with respect to the theoretical density when compared to the $MgB_2$ wires of the present invention. Also, it may be understood that degree of improvement in the bulk density was very small even if the bulk was prepared by using higher hydraulic pressure.

Therefore, it may be understood that the $MgB_2$ wires prepared through Examples of the present invention have packing ratios better than those of wires prepared by typical processes.

EXPERIMENTAL EXAMPLE 3

Density Measurement of $MgB_2$ Wire Prepared Through Powder-In-Tube (PIT) Method Densities of the $MgB_2$ wires prepared according to Comparative Examples 3 and 4 were measured to compare with the theoretical density of 2.63 $g/cm^3$, and the results thereof are presented in Table 3 below.

TABLE 3

Density of $MgB_2$ wire prepared through a PIT method

| $MgB_2$ Wire | Wire Length (mm) | Diameter of $MgB_2$ in Metal sheath (mm) | Wire Density ($g/cm^3$) | Ratio to Theoretical Density (%) |
| --- | --- | --- | --- | --- |
| Before drawing | 100 | 5 | 1.354 | 51.483 |
| After drawing | 100 (length of a portion of wire for density measurement) | 0.6 | 1.727 | 65.665 |

As shown in Table 3, densities of the $MgB_2$ wires prepared by applying the PIT method were in a range of 51% to 65% when compared to the theoretical density. Although the density after drawing is higher than the density before drawing, it is very low value in comparison to the densities of the $MgB_2$ wires prepared by Examples of the present invention. Thus, excellence of the $MgB_2$ wires prepared according to the present invention may be reconfirmed.

EXPERIMENTAL EXAMPLE 4

Evaluation of Resistance Characteristics of $MgB_2$ Wire

Figure 3:
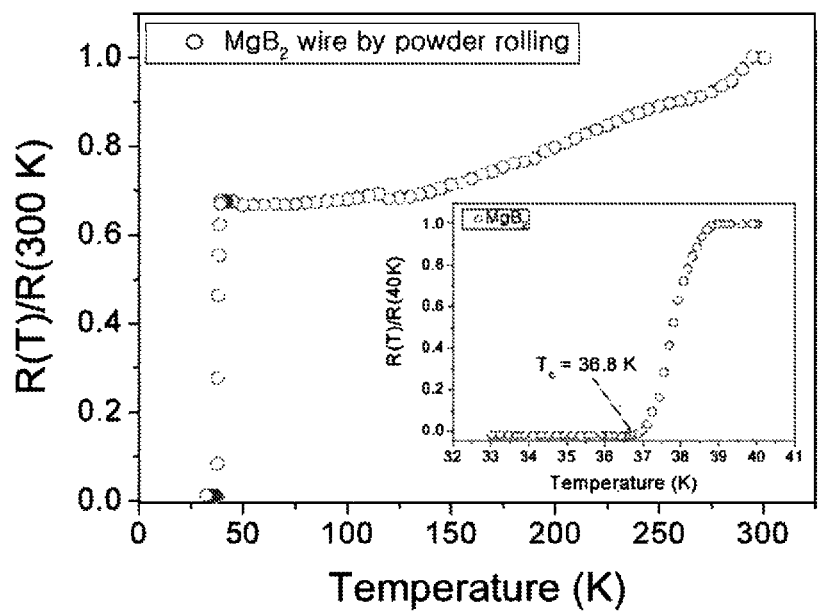
FIG. 3 is a graph showing resistance characteristics of a MgB$_2$ superconducting wire according to a preparing method of the present invention.

Resistance characteristics were evaluated while decreasing the temperature of the $MgB_2$ wire prepared according to Example 1 of the present invention, and the results thereof are presented in FIG. 3.

As shown in FIG. 3, electrical resistance of the $MgB_2$ wire prepared according to the process of the present invention decreased as the temperature decreased from room temperature (300 K). At this time, superconductive transition began at a temperature of about 39 K, and it was confirmed that complete superconducting resistance characteristics were observed at a temperature of 36.8 K.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of preparing a $MgB_2$ superconducting wire, the method comprising the steps of:
   preparing a raw powder for the $MgB_2$ superconducting wire;
   providing the raw powder between a pair of rolling rolls without a tube for powder roll compaction, wherein the raw powder is provided through an outlet of a hopper that is positioned adjacent to an inlet of the rolling rolls; and
   rolling the raw powder to compact it and produce the $MgB_2$ superconducting wire.

2. The method as set forth in claim 1, wherein the raw powder is selected from the group consisting of a pre-reacted $MgB_2$ powder, a mixed powder of magnesium and boron, and a powder in which a dopant is added to the mixed powder.

3. The method as set forth in claim 2, wherein the dopant is selected from the group consisting of SiC, carbon nanotubes, hydrocarbons, silicon oil, a malic acid, tin, and silver.

4. The method as set forth in claim 1, further comprising coating a metal sheath simultaneously with rolling the raw powder to compact it.

5. The method as set forth in claim 4, wherein the coated metal sheath is a powder form or a metal plate form.

6. The method as set forth in claim 1, wherein the rolling rolls are cold or hot rolling rolls.

7. The method as set forth in claim 1, wherein the preparing method further comprises a process of heat treating after rolling.

8. The method as set forth in claim 7, wherein the heat treatment is performed in a pure Ar gas or a mixed gas of Ar and about 4 vol. % to about 10 vol. % of $H_2$.

9. The method as set forth in claim 7, wherein the heat treatment is performed at a temperature range of about 600° C. to about 1000° C.

10. A method of preparing a $MgB_2$ superconducting wire, the method comprising the steps of:
    preparing a raw powder for the $MgB_2$ superconducting wire;
    providing the raw powder between a pair of rolling rolls for powder roll compaction,
    wherein the raw powder is not within a tube when provided between the pair of rolling rolls; and
    rolling the raw powder to compact it and produce the $MgB_2$ superconducting wire.

11. The method as set forth in claim 10, wherein the raw powder is selected from the group consisting of a pre-reacted $MgB_2$ powder, a mixed powder of magnesium and boron, and a powder in which a dopant is added to the mixed powder.

12. The method as set forth in claim 10, wherein the dopant is selected from the group consisting of SiC, carbon nanotubes, hydrocarbons, silicon oil, a malic acid, tin, and silver.

13. The method as set forth in claim 10, further comprising coating a metal sheath simultaneously with rolling the raw powder to compact it.

14. The method as set forth in claim 13, wherein the coated metal sheath is a powder form or a metal plate form.

15. The method as set forth in claim 10, wherein the rolling rolls are cold or hot rolling rolls.

16. The method as set forth in claim 10, wherein the preparing method further comprises a process of heat treating after rolling.

17. The method as set forth in claim 16, wherein the heat treatment is performed in a pure Ar gas or a mixed gas of Ar and about 4 vol. % to about 10 vol. % of $H_2$.

18. The method as set forth in claim 16, wherein the heat treatment is performed at a temperature range of about 600° C. to about 1000° C.

* * * * *